United States Patent
Lee et al.

(10) Patent No.: US 7,569,461 B2
(45) Date of Patent: Aug. 4, 2009

(54) METHOD OF FABRICATING NITRIDE-BASED COMPOUND LAYER, GAN SUBSTRATE AND VERTICAL STRUCTURE NITRIDE-BASED SEMICONDUCTOR LIGHT EMITTING DEVICE

(75) Inventors: Soo Min Lee, Seoul (KR); Cheol Kyu Kim, Seoul (KR); Jaeun Yoo, Kyungki-do (KR); Sung Hwan Jang, Kyungki-do (KR); Masayoshi Koike, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 250 days.

(21) Appl. No.: 11/471,697

(22) Filed: Jun. 21, 2006

(65) Prior Publication Data

US 2006/0286777 A1 Dec. 21, 2006

(30) Foreign Application Priority Data

Jun. 21, 2005 (KR) ...................... 10-2005-0053331

(51) Int. Cl.
*H01L 21/20* (2006.01)
(52) U.S. Cl. ........................... 438/481; 438/39; 438/41; 438/42; 438/44; 438/46; 438/47
(58) Field of Classification Search ............. 438/39–47, 438/481
See application file for complete search history.

(56) References Cited

U.S. PATENT DOCUMENTS

| | | | |
|---|---|---|---|
| 6,111,277 A | 8/2000 | Ikeda | |
| 6,121,121 A * | 9/2000 | Koide | ...................... 438/481 |
| 6,303,405 B1 | 10/2001 | Yoshida et al. | |
| 6,471,770 B2 * | 10/2002 | Koike et al. | ................... 117/97 |
| 6,607,931 B2 | 8/2003 | Streubel | |

(Continued)

FOREIGN PATENT DOCUMENTS

DE 100 08 583 A1 9/2001

(Continued)

OTHER PUBLICATIONS

German Office Action Issued in Corresponding Application mailed on Jan. 3, 2006.

(Continued)

*Primary Examiner*—Kevin M Picardat
*Assistant Examiner*—Bac H Au
(74) *Attorney, Agent, or Firm*—McDermott Will & Emery LLP

(57) ABSTRACT

In a method for fabricating a nitride-based compound layer, first, a GaN substrate is prepared. A mask layer with a predetermined pattern is formed on the GaN substrate to expose a partial area of the GaN substrate. Then a buffer layer is formed on the partially exposed GaN substrate. The buffer layer is made of a material having a 10% or less lattice mismatch with GaN. Thereafter, the nitride-based compound is grown laterally from a top surface of the buffer layer toward a top surface of the mask layer and the nitride-based compound layer is vertically grown to a predetermined thickness. Also, the mask layer and the buffer layer are removed via wet-etching to separate the nitride-based compound layer from the GaN substrate.

14 Claims, 4 Drawing Sheets

U.S. PATENT DOCUMENTS

| | | | |
|---|---|---|---|
| 6,693,021 B1 * | 2/2004 | Motoki et al. | 438/481 |
| 6,924,159 B2 * | 8/2005 | Usui et al. | 438/22 |
| 2001/0024837 A1 | 9/2001 | Streubel | |
| 2002/0022290 A1 | 2/2002 | Kong et al. | |
| 2002/0048909 A1 * | 4/2002 | Biwa et al. | 438/483 |
| 2002/0175340 A1 * | 11/2002 | Shibata et al. | 257/103 |
| 2003/0186475 A1 * | 10/2003 | Ueda et al. | 438/22 |
| 2005/0003572 A1 * | 1/2005 | Hahn et al. | 438/47 |
| 2005/0164418 A1 * | 7/2005 | Goto et al. | 438/39 |
| 2006/0236923 A1 * | 10/2006 | Kouvetakis et al. | 117/108 |

FOREIGN PATENT DOCUMENTS

| | | |
|---|---|---|
| EP | 0 966 047 A2 | 12/1999 |
| EP | 1 041 610 A1 | 10/2000 |
| JP | 2000-101139 | 4/2000 |
| JP | 2000-173929 | 6/2000 |
| JP | 2005-001928 | 1/2005 |

OTHER PUBLICATIONS

Japanese Office Action issued in Japanese Patent Application No. 2006-170286, dated May 12, 2009.

* cited by examiner (a)

Lapping/polishing (b)

METHOD OF FABRICATING NITRIDE-BASED COMPOUND LAYER, GaN SUBSTRATE AND VERTICAL STRUCTURE NITRIDE-BASED SEMICONDUCTOR LIGHT EMITTING DEVICE

CLAIM OF PRIORITY

This application claims the benefit of Korean Patent Application No. 2005-53331 filed on Jun. 21, 2005 in the Korean Intellectual Property Office, the disclosure of which is incorporated herein by reference.

BACKGROUND OF THE INVENTION

1. Field of the Invention

The present invention relates to a method for fabricating a nitride-based compound layer, a GaN substrate and a vertical nitride-based semiconductor light emitting device. More particularly, the present invention relates to a method for fabricating a nitride-based compound layer, a GaN substrate and a vertical nitride-based semiconductor light emitting device capable of recycling the expensive GaN substrate by forming a mask layer with a predetermined pattern and a buffer layer on the GaN substrate, laterally growing the nitride-based compound layer, and removing the mask layer and the buffer layer via wet-etching to separate the GaN substrate without impairment.

2. Description of the Related Art

In general, a nitride-based compound is a group III-V compound crystal such as GaN, InN, and AlN, which is widely used for a light emitting device generating light of a short wavelength (ultraviolet ray and green light), especially blue light. The nitride-based compound has been typically manufactured via a sapphire substrate or a SiC substrate due to absence of a commercially available substrate that satisfies lattice match conditions for crystal growth. But the sapphire substrate or SiC substrate has lattice mismatch with the nitride-based compound. This renders it very difficult to grow a high-quality nitride-based compound on the sapphire or SiC substrate.

Meanwhile, a substrate having lattice match with the nitride-based compound, such as a GaN substrate, has been fabricated. However, the GaN substrate is very expensive, and unrecyclable owing to grinding and abrasion that occur during lapping and polishing in a manufacturing process of the light emitting device.

FIG. 1 is a cross-sectional view partially illustrating a method for fabricating a nitride-based light emitting device using a GaN substrate according to the prior art. As shown in FIG. 1(a), in a conventional method, a light emitting structure 12 made of a nitride-based compound semiconductor is formed on a GaN substrate 11 with a predetermined thickness d. Then in order to easily separate a final structure obtained into individual devices, an underside of the GaN substrate is ground and abraded via lapping and polishing to reduce the thickness d' of the GaN substrate 11 as shown in FIG. 1(b).

This conventional method for fabricating the nitride-based semiconductor light emitting device using the GaN substrate is disadvantageous in that the high-priced GaN substrate is unrecyclable due to grinding and abrasion caused by lapping and polishing.

Therefore, in the art, there has been a demand for a technology of recycling the high-priced GaN substrate to reduce production costs.

SUMMARY OF THE INVENTION

The present invention has been made to solve the foregoing problems of the prior art and therefore an object according to an aspect of the present invention is to provide a method for fabricating a nitride-based compound layer, a GaN substrate and a vertical nitride-based semiconductor light emitting device capable of recycling the expensive GaN substrate by forming a mask layer with a predetermined pattern and a buffer layer on the GaN substrate, laterally growing the nitride-based compound layer, and removing the mask layer and the buffer layer via wet-etching to separate the GaN substrate without damage.

According to an aspect of the invention for realizing the object, there is provided a method for fabricating a nitride-based compound layer, comprising steps of:

preparing a GaN substrate;

forming a mask layer with a predetermined pattern on the GaN substrate to expose a partial area of the GaN substrate;

forming a buffer layer on the partially exposed GaN substrate, the buffer layer made of a material having a 10% or less lattice mismatch with GaN;

laterally growing a nitride-based compound from a top surface of the buffer layer toward a top surface of the mask layer and vertically growing the nitride-based compound layer to a predetermined thickness; and removing the mask layer and the buffer layer via wet-etching to separate the nitride-based compound layer from the GaN substrate.

Preferably, the buffer layer has a 5% or less lattice mismatch with GaN.

According to an embodiment of the invention, preferably, the buffer layer comprises one selected from a group consisting of ZnO, $Ga_2O_3$ and $ZrB_2$. Preferably, the mask layer comprises a silicon oxide film or a silicon nitride film. Also, preferably, a wet-etching solution used in the wet-etching comprises HCl.

According to another aspect of the invention for realizing the object, there is provided a method for fabricating a GaN substrate comprising steps of:

preparing a seed GaN substrate;

forming a mask layer with a predetermined pattern on the seed GaN substrate to expose a partial area of the GaN substrate;

forming a buffer layer on the partially exposed seed GaN substrate, the buffer layer made of a material having a 10 % or less lattice mismatch with GaN;

laterally growing the GaN from a top surface of the buffer layer toward a top surface of the mask layer and vertically growing the GaN to form the GaN substrate with a predetermined thickness; and removing the mask layer and the buffer layer via wet-etching to separate the GaN substrate from the seed GaN substrate.

According to another embodiment of the invention, preferably, the GaN substrate forming step comprises growing the GaN by HVPE.

According to further another aspect of the invention for realizing the object, there is provided a method for fabricating a vertical nitride semiconductor light emitting device, comprising steps of:

preparing a GaN substrate;

forming a mask layer with a predetermined pattern to expose a partial area of the GaN substrate;

forming a buffer layer on the partially exposed GaN substrate, the buffer layer made of a material having a 10% or less lattice mismatch with GaN;

laterally growing a first conductivity-type nitride-based compound semiconductor doped with first conductive impurities from a top surface of the buffer layer toward a top surface of the mask layer and vertically growing the first conductivity-type nitride-based compound semiconductor to form a first conductivity-type nitride-based compound semiconductor layer, and growing an active layer made of a nitride-based compound on the first conductivity-type nitride-based compound semiconductor layer and a second conductivity type nitride-based compound layer doped with second conductive impurities on the active layer, thereby forming a light emitting structure.

forming a conductive carrier substrate on the light emitting structure; and removing the mask layer and the buffer layer via wet-etching to separate the light emitting structure from the GaN substrate.

According to further another embodiment of the invention, preferably, the light emitting structure forming step comprises growing the nitride-based semiconductor compound by MOCVDE.

According to further another embodiment of the invention, the method for fabricating the vertical nitride semiconductor light emitting device further comprises forming a first electrode on an underside of the first conductivity-type nitride-based compound semiconductor layer from which the GaN substrate is separated, and a second electrode on a top surface of the conductive carrier substrate.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
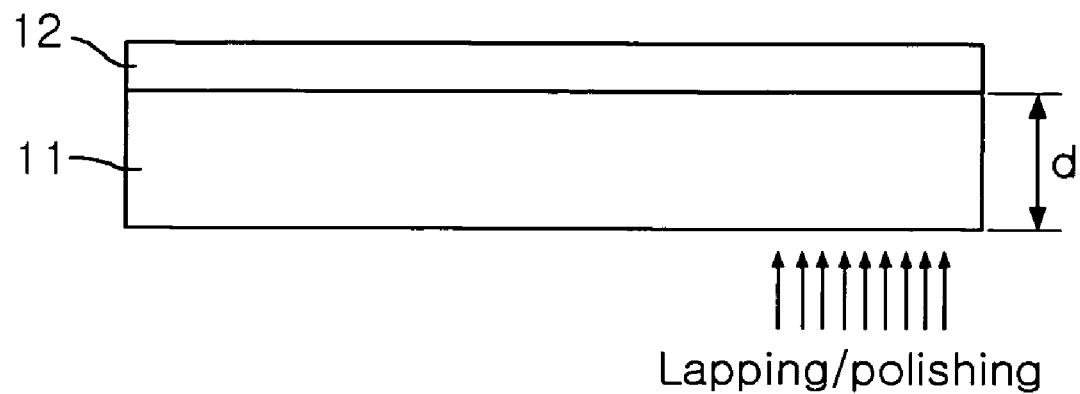
FIG. 1 is a cross-sectional view illustrating a method for manufacturing a nitride-based semiconductor light emitting device via a GaN substrate according to the prior art.
Figure 1:
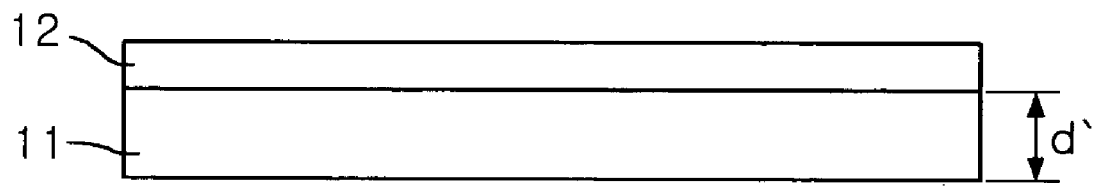

The present invention now will be described more fully hereinafter with reference to the accompanying drawings, in which preferred embodiments of the invention are shown. This invention, however, be embodied in may different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signals are used to designate the same or similar components throughout.

Figure 2:
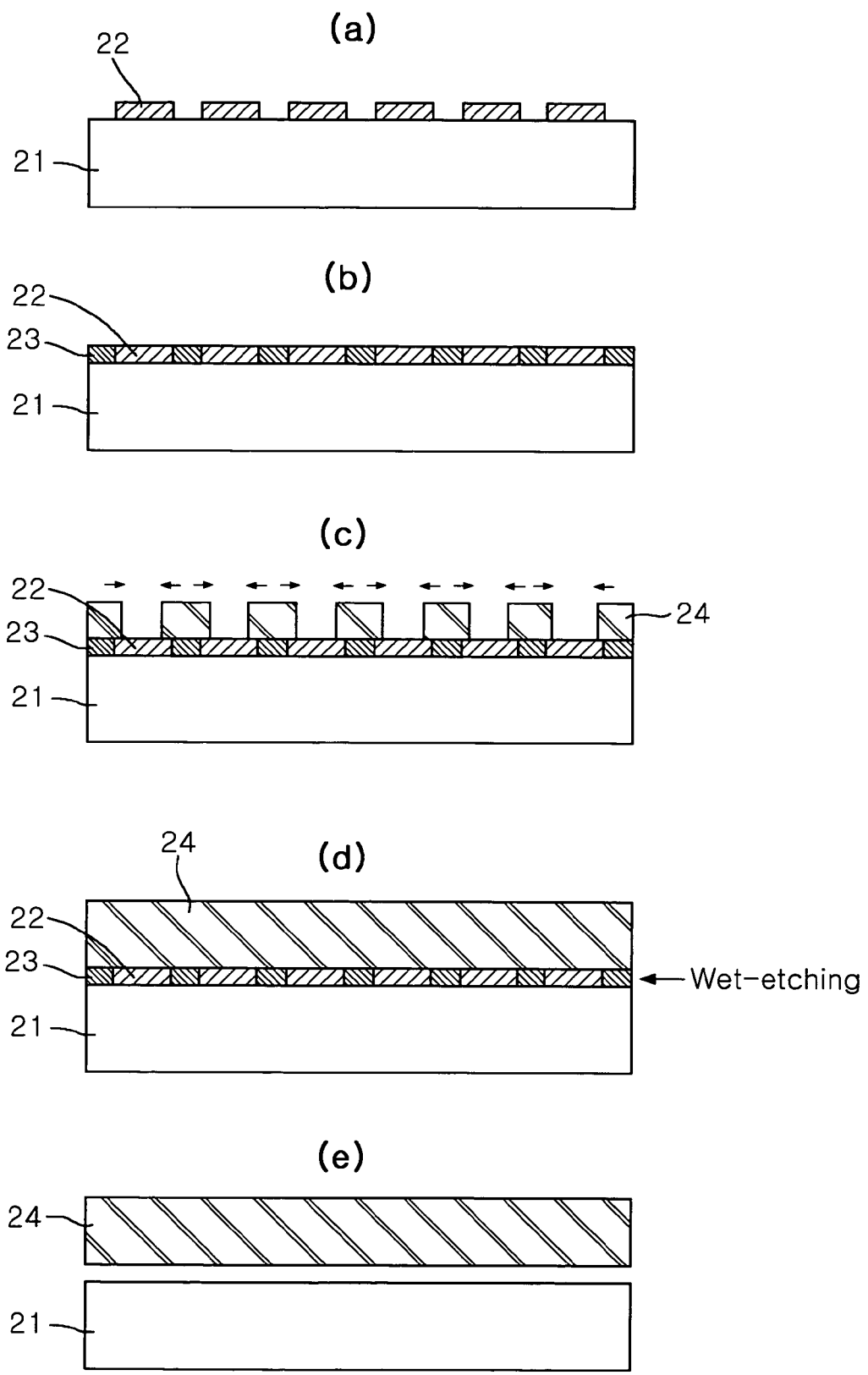
FIG. 2 is a cross-sectional view illustrating a method for manufacturing a nitride-based semiconductor light emitting device and a GaN substrate according to an embodiment of the invention.

FIG. 2 is a cross-sectional view illustrating a method for fabricating a nitride-based compound layer and a GaN substrate according to an embodiment of the invention. In FIG. 2, reference numeral 24 denotes both a nitride-based compound layer and a GaN substrate fabricated. Unless explained otherwise, the term "nitride compound layer" is construed to include the GaN substrate. In addition, when it is necessary to distinguish the GaN substrate for growing the nitride-based compound layer from the GaN substrate fabricated, the GaN substrate for growing the nitride-based compound layer is termed a "seed GaN substrate".

Referring to FIG. 2, first, as shown in FIG. 2(a), a GaN substrate 21 is prepared and a mask layer 22 with a predetermined pattern is formed on the GaN substrate 21. The mask layer 22 is made of a material removable by a later wet-etching process. The material for the mask layer 22 is exemplified by dielectrics such as a silicon oxide film or a silicon nitride film, and the silicon oxide film is most preferable. The mask layer 22 can be formed by depositing the dielectrics via Plasma Chemical Vapor Deposition (PCVD). Preferably, the mask layer 22 is formed of a plurality of stripes which are uniformly spaced and disposed parallel to one another, and a top surface of the GaN substrate 21 is exposed therebetween.

Then, as shown in FIG. 2(b), a buffer layer 23 made of a material having a 10% or less lattice mismatch with GaN is formed on the exposed GaN substrate 21. The lattice mismatch with the GaN can be calculated through Equation 1 below:

$$\Delta a = \left| \frac{a_x - a_{GaN}}{a_{Gan}} \right| \times 100, \qquad \text{Equation 1}$$

where $\Delta a$ is a difference in lattice mismatch with GaN (%), $a_x$ is a lattice constant of a comparative material, and $a_{GaN}$ is a lattice constant of GaN.

The buffer layer 23 is made of a material having preferably a 10% lattice mismatch with GaN, and most preferably a 5% or less lattice mismatch. In case where the nitride-based compound layer is grown from a top surface of the buffer layer in a later process, crystal information of the underlying GaN substrate 21 is transferred through the buffer layer 23. Thus a smaller difference in lattice constant between the buffer layer 23 and the GaN leads to a higher-quality nitride-based compound layer. For example, when Equation 1 is employed, ZnO with a lattice constant of 3.325 Å has a lattice constant difference of about 4% from the GaN with a lattice constant of 3.184 Å. The buffer layer 23 should exhibit the aforesaid crystal characteristics and be made of a material easily removable together with the mask layer 22 in a later wet-etching process. The material satisfying such properties is exemplified by the aforesaid ZnO, $Ga_2O_3$ or $ZrB_2$. The buffer layer 23 may be formed of the aforesaid material via sputtering or Chemical Vapor Deposition (CVD).

Figure 3:
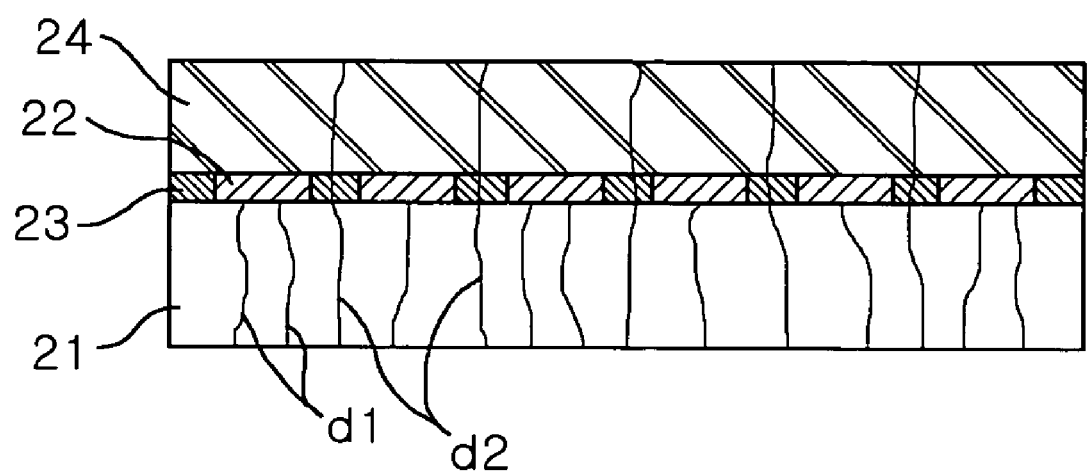
FIG. 3 is a schematic view illustrating defects in a nitride-based semiconductor layer grown laterally.

Next, as shown in FIG. 2(c), a nitride-based compound 24 is laterally grown from the top surface of the buffer layer 23 toward a top surface of the mask layer 22. Preferably, the nitride-based compound has a composition expressed by $Al_xIn_yGa_{(1-x-y)}N$, where $0 \leq x \leq 1$, $0 \leq y \leq 1$ and $0 \leq x+y \leq 1$. To fabricate a GaN substrate, the GaN is employed for the nitride-based compound. After the lateral growth process, the nitride-based compound is vertically grown into the nitride-based compound layer having a predetermined thickness as shown in FIG. 2(d). In this process, the nitride-based compound is grown by a well-known deposition process such as Metal Organic Chemical Vapor Deposition (MOCVD), Molecular Beam Epitaxy (MBE) or Hydride Vapor Phase Epitaxy (HVPE). Especially, in a process for growing the GaN substrate, preferably, the HVPE is adopted. Such lateral growth and vertical growth can be achieved by adjusting several conditions for a deposition process. For example, a higher temperature and a lower pressure in the deposition, and a higher ratio of group III-V materials (V/III) enhances the lateral growth The aforesaid lateral growth is suited to grow a high-quality nitride-based semiconductor layer. FIG. 3 is a schematic view illustrating defects in the nitride-based semiconductor layer formed by lateral growth. A seed GaN substrate exhibits less defect (dislocation) density, but defects are transferred to the overlying nitride-based compound layer grown epitaxially. Therefore, by a general growth method, it is hard to fabricate the nitride-based semiconductor layer having a higher quality than the seed GaN substrate. But as shown in FIG. 3, by the lateral growth, some defects d1 of the seed GaN substrate 21 are blocked from being transferred to the nitride-based compound layer 24 by the mask layer 23. This allows the nitride-based compound layer 24 to have a higher quality and lower defect density than the seed GaN substrate 21.

Then, referring to FIG. 2(d), after the nitride-based compound layer 24 is grown, the mask layer 22 and the buffer layer 22 are removed via wet-etching. A wet-etching solution used in the wet-etching of the mask layer 22 and the buffer layer 23 is exemplified by HCl or HCl. This wet-etching process removes the mask layer 22 and the buffer layer 23, thereby separating the newly grown nitride-based compound layer 24 from the seed GaN substrate, as shown in FIG. 2(e).

The removal by the wet-etching does not affect the high-priced seed GaN substrate 21, which thus becomes recyclable. Also, the lateral growth produces the nitride-based compound layer or GaN substrate having a high quality than the seed GaN substrate 21.

Figure 4:
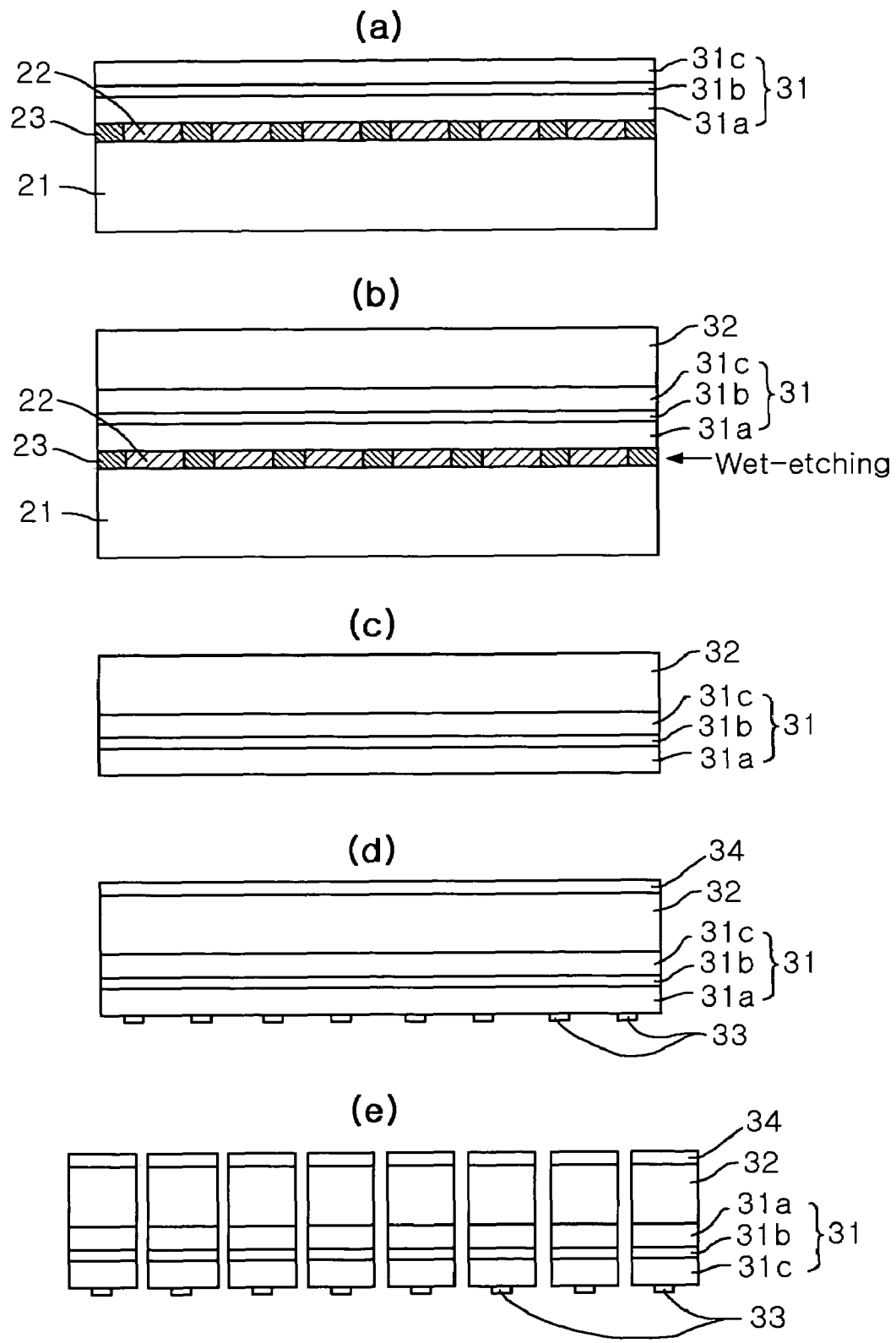
FIG. 4 is a cross-sectional view illustrating a method for manufacturing a vertical nitride-based semiconductor light emitting device according to the invention.

According to the invention, a vertical nitride-based semiconductor light emitting device is fabricated by employing the aforesaid method for forming the nitride-based compound layer. FIG. 4 is a cross-sectional view illustrating a method for fabricating a vertical nitride-based semiconductor light emitting device according to the invention.

First, referring to FIG. 4(a), a light emitting structure 31 is formed by the aforesaid method for growing the nitride-based compound layer. The light emitting structure 31 includes a first conductivity type nitride-based compound semiconductor layer 31a, an active layer 31b formed on the first conductivity type nitride-based compound semiconductor layer 31a and a second conductivity-type nitride-based compound semiconductor layer 31c formed on the active layer 31b. To form the first conductivity-type nitride-based compound semiconductor layer 13a, a first conductivity-type nitride-based compound semiconductor doped with first conductive impurities are laterally grown from a top surface of the buffer layer 23 formed on the GaN substrate 21 toward a top surface of the mask layer 22. Then the first conductivity type nitride-based compound semiconductor is vertically grown. Also, the active layer 31b is made of the nitride-based compound semiconductor and the second conductivity-type nitride-based compound semiconductor layer 31c is doped with second conductive impurities.

In the method for manufacturing the nitride-based semiconductor light emitting device according to the invention, the mask layer 22 and the buffer layer 23 are formed in a manner equal to the aforesaid method for forming the nitride-based compound layer. The only difference is that in laterally growing the first nitride-based compound semiconductor, the first conductive impurities are doped to fabricate a conductive semiconductor. For example, if the first conductivity type is n-type, Si, Ge, Se, Te or C may be added for the first conductivity type impurities. The active layer 31b, which serves to emit light, has a single or multiple quantum well structure and is made of the nitride-based compound such as GaN or InGaN. Also, if the second conductivity type is p-type, the second conductivity type nitride-based compound semiconductor layer 31c is doped with p-type impurities such as Mg, Zn or Be. The light emitting structure can be formed via a well-known deposition process such as MOCVD, MBE or HVPE, and the MOCVD is most preferable.

Next, as shown in FIG. 4(b), a carrier substrate 32 is formed on the second conductivity-type nitride-based compound semiconductor layer 31c. The conductive carrier substrate 32 is made of Si, GaAs or a conductive metal. The conductive carrier substrate 32 is bonded to the second conductivity-type nitride-based compound semiconductor layer 31c via an additional intermediate layer. Alternatively, to form the conductive carrier substrate 32, a metal plating layer may be formed on the second conductivity type nitride-based compound semiconductor layer 31c to a predetermined thickness. In the vertical nitride-based semiconductor light emitting device according to the invention, light exits through a surface of the first conductivity-type nitride-based compound semiconductor layer 31a from which the GaN substrate 21 is separated. Therefore, a reflective layer maybe formed between the second conductivity type nitride-based compound semiconductor layer 31c and the conductive carrier substrate 32.

Then, as shown in FIG. 4(c), after the conductive carrier substrate 32 is formed, the mask layer 22 and the buffer layer 23 are removed via wet-etching to separate the light emitting structure 31 from the GaN substrate 21. As described above, according to the invention, the expensive GaN substrate 21 is separated unharmed via wet-etching, and thus recyclable.

Thereafter, as shown in FIG. 4(d), a first electrode 33 is formed on an underside of the first conductivity type nitride-based compound semiconductor layer 31a from which the GaN substrate is separated, and a second electrode 34 is formed on a top surface of the conductive carrier substrate 32. Then, as shown in FIG. 4(e), a final structure obtained is divided into individual devices, thereby completing the vertical nitride-based semiconductor device. In the vertical nitride-based semiconductor light emitting device, light chiefly exits through the underside surface of the first conductivity type nitride-based compound semiconductor layer 31a from which the GaN substrate is separated. To improve current spread, a transparent electrode layer made of ITO may be interposed between the first electrode 33 formed on the underside of the first conductivity type nitride-based compound semiconductor layer 31a and the first conductivity type nitride based compound semiconductor layer 31a. Moreover, in case where the conductive carrier substrate 32 is made of a metal material having excellent electrical conductivity, the carrier substrate 32 itself is usable as an electrode, which thus obviates a need for forming the second electrode 34.

In this fashion, in a method for manufacturing a vertical nitride-based semiconductor light emitting device according to the invention, a GaN substrate is separated unharmed via wet-etching, instead of being ground and abraded via lapping or polishing. This allows recycling of the high-priced GaN substrate, thereby reducing production costs. Further, a nitride-based compound semiconductor is grown on a high-quality GaN substrate by lateral growth. This produces a higher-quality nitride-based compound semiconductor layer than the GaN substrate, thereby enhancing brightness of the light emitting device.

As set forth above, according to the invention, the expensive GaN substrate is separated without impairment via wet-etching, and consequently recyclable. This advantageously lowers manufacture costs for the nitride-based compound layer, GaN substrate and nitride-based semiconductor light emitting device. Also, the nitride-based compound or nitride-based compound semiconductor is laterally grown, advantageously producing the nitride-based compound semiconductor, the GaN substrate and the nitride-based semiconductor light emitting device, which exhibit a higher quality than the GaN substrate for growing such materials. Especially, the invention advantageously improves brightness of the nitride-based semiconductor light emitting device.

While the present invention has been shown and described in connection with the preferred embodiments, it will be apparent to those skilled in the art that modifications and variations can be made without departing from the spirit and scope of the invention as defined by the appended claims.

What is claimed is:

1. A method for fabricating a nitride-based compound layer, comprising steps of:
   preparing a GaN substrate;
   forming a mask layer with a predetermined pattern on the GaN substrate to expose a partial area of the GaN substrate;
   forming a buffer layer on the partially exposed GaN substrate, the buffer layer made of a material having a 10% or less lattice mismatch with GaN;
   laterally growing a nitride-based compound from a top surface of the buffer layer toward a top surface of the mask layer and vertically growing the nitride-based compound layer to a predetermined thickness; and
   removing the mask layer and the buffer layer via wet-etching to separate the nitride-based compound layer from the GaN substrate,
   wherein the buffer layer is in direct contact with the GaN substrate and made of a material removable together with the mask layer in the wet-etching process.

2. The method according to claim 1, wherein the buffer layer has a 5% or less lattice mismatch with GaN.

3. The method according to claim 1, wherein the buffer layer comprises one selected from a group consisting of ZnO, $Ga_2O_3$ and $ZrB_2$.

4. The method according to claim 1, wherein the mask layer comprises a silicon oxide film or a silicon nitride film.

5. The method according to claim 1, wherein a wet-etching solution used in the wet-etching comprises HCl or HF.

6. A method for fabricating a GaN substrate comprising steps of:
   preparing a seed GaN substrate;
   forming a mask layer with a predetermined pattern on the seed GaN substrate to expose a partial area of the GaN substrate;
   forming a buffer layer on the partially exposed seed GaN substrate, the buffer layer made of a material having a 10% or less lattice mismatch with GaN;
   laterally growing the GaN from a top surface of the buffer layer toward a top surface of the mask layer and vertically growing the GaN to form the GaN substrate with a predetermined thickness; and
   removing the mask layer and the buffer layer via wet-etching to separate the GaN substrate from the seed GaN substrates,
   wherein the buffer layer is in direct contact with the GaN substrate and made of a material removable together with the mask layer in the wet-etching process.

7. The method according to claim 6, wherein the buffer layer has a 5% or less lattice mismatch with GaN.

8. The method according to claim 6, wherein the buffer layer comprises ZnO, $Ga_2O_3$ and $ZrB_2$.

9. The method according to claim 6, wherein the mask layer comprises a silicon oxide film or a silicon nitride film.

10. The method according to claim 6, wherein a wet-etching solution used in the wet-etching comprises HCl or HF.

11. The method according to 6, wherein the GaN substrate forming step comprises growing the GaN by HVPE.

12. A method for fabricating a nitride-based compound layer, comprising steps of:
    preparing a GaN substrate;
    forming a mask layer with a predetermined pattern on the GaN substrate to expose a partial area of the GaN substrate;
    forming a buffer layer on the partially exposed GaN substrate, the buffer layer made of $Ga_2O_3$ or $ZrB_2$;
    laterally growing nitride-based compound from a top surface of the buffer layer toward a top surface of the mask layer and vertically growing the nitride-based compound layer to a predetermined thickness; and
    removing the mask layer and the buffer layer via wet-etching to separate the nitride-based compound layer from the GaN substrate.

13. The method according to claim 12, wherein the mask layer comprises a silicon oxide film or a silicon nitride film.

14. The method according to claim 12, wherein a wet-etching solution used in the wet-etching comprises HCl or HF.

* * * * *